(12) United States Patent
Callard et al.

(10) Patent No.: US 8,179,849 B2
(45) Date of Patent: May 15, 2012

(54) MAPPING OF DISTRIBUTED RESOURCE BLOCK INDICES TO PHYSICAL RESOURCE BLOCKS

(75) Inventors: Aaron James Callard, Ottawa (CA); Jianglei Ma, Kanata (CA); David Walter Paranchych, Kirkland, WA (US)

(73) Assignee: Rockstar Bidco, L.P., New York, NY (US)

( * ) Notice: Subject to any disclaimer, the term of this patent is extended or adjusted under 35 U.S.C. 154(b) by 646 days.

(21) Appl. No.: 12/347,033

(22) Filed: Dec. 31, 2008

(65) Prior Publication Data

US 2009/0175230 A1   Jul. 9, 2009

Related U.S. Application Data

(60) Provisional application No. 61/019,976, filed on Jan. 9, 2008.

(51) Int. Cl.
*H04W 4/00* (2009.01)
*H04B 15/00* (2006.01)

(52) U.S. Cl. ........................ 370/329; 455/501

(58) Field of Classification Search ................. None
See application file for complete search history.

(56) References Cited

U.S. PATENT DOCUMENTS

| | | | |
|---|---|---|---|
| 2004/0022179 A1* | 2/2004 | Giannakis et al. | 370/207 |
| 2004/0125772 A9 | 7/2004 | Wu et al. | |
| 2005/0237919 A1 | 10/2005 | Pettendorf et al. | |
| 2007/0053320 A1* | 3/2007 | Rinne et al. | 370/329 |
| 2007/0242636 A1* | 10/2007 | Kashima et al. | 370/329 |

OTHER PUBLICATIONS

International Search Report and Written Opinion dated Feb. 9, 2009 for International Application No. PCT/US08/88613, International Filing Date Dec. 31, 2008 (8-pages).

* cited by examiner

*Primary Examiner* — John Blanton
(74) *Attorney, Agent, or Firm* — Christopher & Weisberg, P.A.

(57) ABSTRACT

An apparatus for communication using a wireless communication network includes an interleaver and a transceiver. The interleaver co-exists with a localized transmission arrangement if the localized transmission arrangement is present and interleaves data packets for a distributed transmission arrangement by mapping a set of logical indices to a set of physical resource blocks. The set of logical indices include sequential logical indices that are separated by a maximum spacing within the set. The transceiver is in electrical communication with the interleaver. The transceiver is operable to transmit and receive data packets through the wireless communication network.

17 Claims, 7 Drawing Sheets

MAPPING OF DISTRIBUTED RESOURCE BLOCK INDICES TO PHYSICAL RESOURCE BLOCKS

CROSS-REFERENCE TO RELATED APPLICATION

This application is related to and claims priority to U.S. Provisional Application Ser. No. 61/019,976, filed Jan. 9, 2008, entitled MAPPING OF DISTRIBUTED RESOURCE BLOCK INDICES TO PHYSICAL RESOURCE BLOCKS, the entirety of which is incorporated herein by reference.

STATEMENT REGARDING FEDERALLY SPONSORED RESEARCH OR DEVELOPMENT n/a

FIELD OF THE INVENTION

The present invention relates generally to a method and system for wireless communication network resource block allocation and more specifically to a method and system for mapping between distributed resource block indices and physical resource blocks within a wireless communication network.

BACKGROUND OF THE INVENTION

Long-Term Evolution ("LTE") is an effort to develop advanced wireless mobile radio technology that aims to succeed current Third Generation ("3G") telecommunication standards and technology for mobile networking, including but not limited to Wideband Code Division Multiple Access ("WCDMA"), High-Speed Downlink Packet Access ("HSDPA"), and High-Speed Uplink Packet Access ("HSUPA") technology. The actual standard is known as the International Telecommunication Union ("ITU") 3rd Generation Partnership Project ("3GPP"), Release 8, although the term LTE is often used to reference the standard. LTE is considered by many to be a Fourth Generation ("4G") technology, both because it is faster than 3G, and because, like the Internet, LTE uses an "all-IP" architecture where all information, including voice, is handled as data.

The LTE standard presently supports two modes of data allocation, localized and distributed. Localized transmission is intended for frequency selective scheduling, while distributed transmission is intended to maximize the amount of frequency diversity when sub-band channel knowledge is not available or out-of-date at the scheduler.

The minimum resource allocation size is called a Virtual Resource Block ("VRB"). Two types of VRBs, diversity VRB and localized VRB, are used to support the localized transmission and the distributed transmission. A Physical Resource Block ("PRB") is a set of time frequency resources that is the same size as a VRB. The mapping of a VRB to a PRB is decided for localized transmission as a simple identity mapping, i.e., first VRB goes to first PRB, second VRB goes to second PRB, etc.

For a localized VRB assignment, two methods may be applied: a "compact" method and a "full" method. The compact method can only allocate consecutive VRB indices, and thus has limited flexibility. The full method assigns VRBs in one of two ways. First, consecutive VRBs may be grouped into groups of k which is equal to 1, 2, 3, or 4 consecutive Resource Blocks ("RBs"), where k depends on the bandwidth, and the RBs are assigned groups using a bitmap. Second, by using a bitmap where each bit represents every $2^{nd}$, $3^{rd}$, or $4^{th}$ RB, depending on the bandwidth, and where an offset indicates the position of the first VRB.

The RB allocation scheme mentioned above is mainly for the localized transmission, as the resources in a localized transmission should be located in close proximity, e.g., contiguously clustered together, for ease in processing and to achieve frequency selective gains. However, for a distributed transmission, the end user devices do not care where the data is located, as long as it scattered across the channel. LTE does not distinguish between the two different types of transmissions and forces the wireless device to use the same mapping scheme for distributed transmission as for localized transmission. This requirement adds additional, unnecessary overhead to processing the distributed transmissions.

However, it is desirable to schedule the localized transmission and the distributed transmission simultaneously. Some diversity gain can be obtained using localized channel allocation by assigning single RBs scattered across the band. However, this practice only works when multiple RBs are assigned to a single device or User Equipment ("UE"). The above methods cannot provide sufficient diversity to small packet sizes. Additionally, the overhead required to schedule individual RB across the band is higher than assigning contiguous resources.

Therefore, what is needed is a system and method for mapping between distributed RB indices and physical RBs which allows for maximal commonality and/or coexistence with a localized transmission arrangement while still achieving good performance and low signaling overhead.

SUMMARY OF THE INVENTION

The present invention advantageously provides a method, apparatus and system for mapping data packets for a distributed transmission arrangement in a wireless communication network. The present invention allows the distributed transmission arrangement to co-exist with a localized transmission arrangement.

One aspect of the present invention provides an apparatus for communication using a wireless communication network. The apparatus includes an interleaver and a transceiver. The interleaver co-exists with a localized transmission arrangement if the localized transmission arrangement is present and interleaves assigned resources for a distributed transmission arrangement by mapping a set of logical indices to a set of physical resource blocks. The set of logical indices includes sequential logical indices separated by a maximum spacing within the set. The transceiver is in electrical communication with the interleaver. The transceiver is operable to transmit and receive data packets through the wireless communication network.

In accordance with another aspect, the present invention provides a method of mapping assigned resources for a distributed transmission arrangement in a wireless communication network. A set of logical indices is mapped to a set of physical resource blocks. The set of logical indices includes sequential logical indices separated by a maximum spacing within the set. The mapping is optimized for co-existence with a localized transmission arrangement.

In accordance with yet another aspect, the present invention provides a system for mapping assigned resources for distributed transmission through a Long Term Evolution communication network. The system includes a transmitting apparatus and a receiving apparatus. The transmitting apparatus includes an interleaver and a transceiver. The interleaver co-exists with a localized transmission arrangement if the localized transmission arrangement is present and interleaves data packets for a distributed transmission arrangement by mapping a set of logical indices to a set of physical resource blocks. The set of logical indices includes sequential logical indices separated by a maximum spacing within the set. The transceiver is electrically connected to the interleaver. The transceiver transmits data packets through the Long Term Evolution communication network. The receiving apparatus is in communication with the transmitting apparatus. The receiving apparatus includes a transceiver and a deinterleaver. The transceiver receives data packets from the Long Term Evolution communication network. The deinterleaver is electrically connected to the transceiver. The deinterleaver deinterleaves interleaved data packets received from the Long Term Evolution network.

BRIEF DESCRIPTION OF THE DRAWINGS

A more complete understanding of the present invention, and the attendant advantages and features thereof, will be more readily understood by reference to the following detailed description when considered in conjunction with the accompanying drawings wherein.

DETAILED DESCRIPTION OF THE INVENTION

Figure 1:
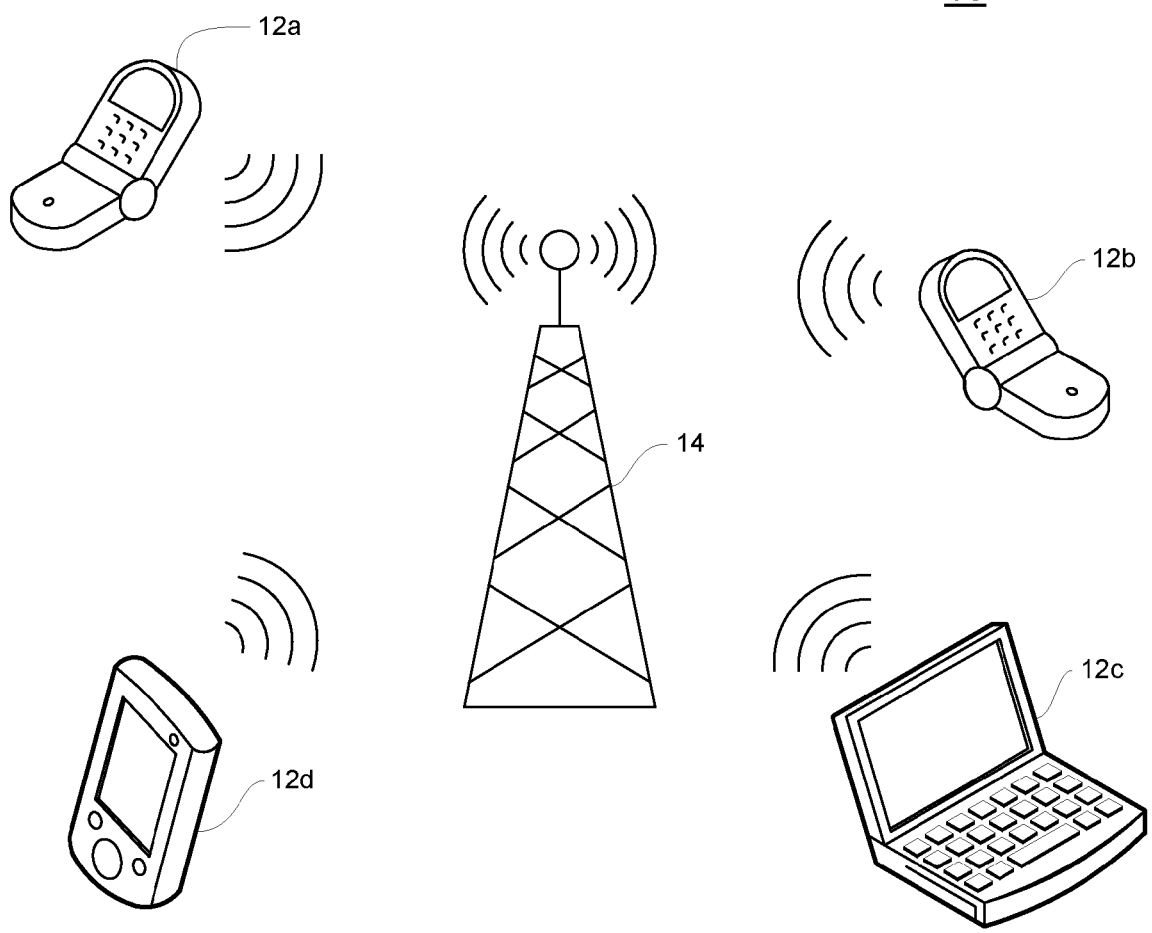
FIG. 1 is a block diagram of an exemplary Long Term Evolution ("LTE") communication system with diversity virtual resource block ("VRB") mapping between distributed resource block indices and physical resource blocks constructed in accordance with the principles of the present invention.

Before describing in detail exemplary embodiments that are in accordance with the present invention, it is noted that the embodiments reside primarily in combinations of apparatus components and processing steps related to implementing a system and method for diversity virtual resource block ("VRB") mapping between distributed resource block indices and physical resource blocks. Accordingly, the system and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

As used herein, relational terms, such as "first" and "second," "top" and "bottom," and the like, may be used solely to distinguish one entity or element from another entity or element without necessarily requiring or implying any physical or logical relationship or order between such entities or elements.

One embodiment of the present invention advantageously provides a method and system for mapping a single VRB to portions of a fixed number ("Nd") of Physical Resource Blocks ("PRBs") for distributed transmission arrangement according to a pre-defined pattern. A PRB is a set of time/frequency resources having an equal size as a VRB. For example, a PRB may represent a set of Orthogonal Frequency-Division Multiplexing ("OFDM") sub-carriers.

"Co-existence" means that users with localized resources, as well as users with distributed resources, may be assigned with a minimum of signaling overhead and/or unused resources. In practice, co-existence of a localized and a distributed transmission arrangement allows all resources, or as many as possible, of the different distributed users to be grouped together. That way, the remaining resources can be partitioned off to the various localized users. Localized users do not have full flexibility in the resources that can be assigned to them, thus it is important that the resources left over from distributed users follow a pattern which fits well with how the localized transmission can assign tones. If this is not the case, then scheduling the localized users becomes very difficult, resulting in both increased complexity on the side of the scheduler and reduced performance as frequency selective scheduling becomes less accurate.

Referring now to the drawing figures in which like reference designators refer to like elements, there is shown in FIG. 1 an exemplary Long Term Evolution ("LTE") communication system 10 with diversity VRB mapping between distributed resource block indices and physical resource blocks of a communication device. The LTE communication system 10 includes a plurality of communication devices 12a, 12b, 12c, 12d (collectively referenced as communication device 12) operating through one or more base stations 14. The communication device 12 may be a wireless communication device such as a cellular phone, a smart phone, a personal digital assistant ("PDA"), a laptop computer, a desktop computer, an electronic book reader, another base station, or any other device commonly receiving data packets through a wireless communication system base station 14. Although not shown, base station 14 communicates with other base stations 14 and other external networks via a backbone network.

Figure 2:
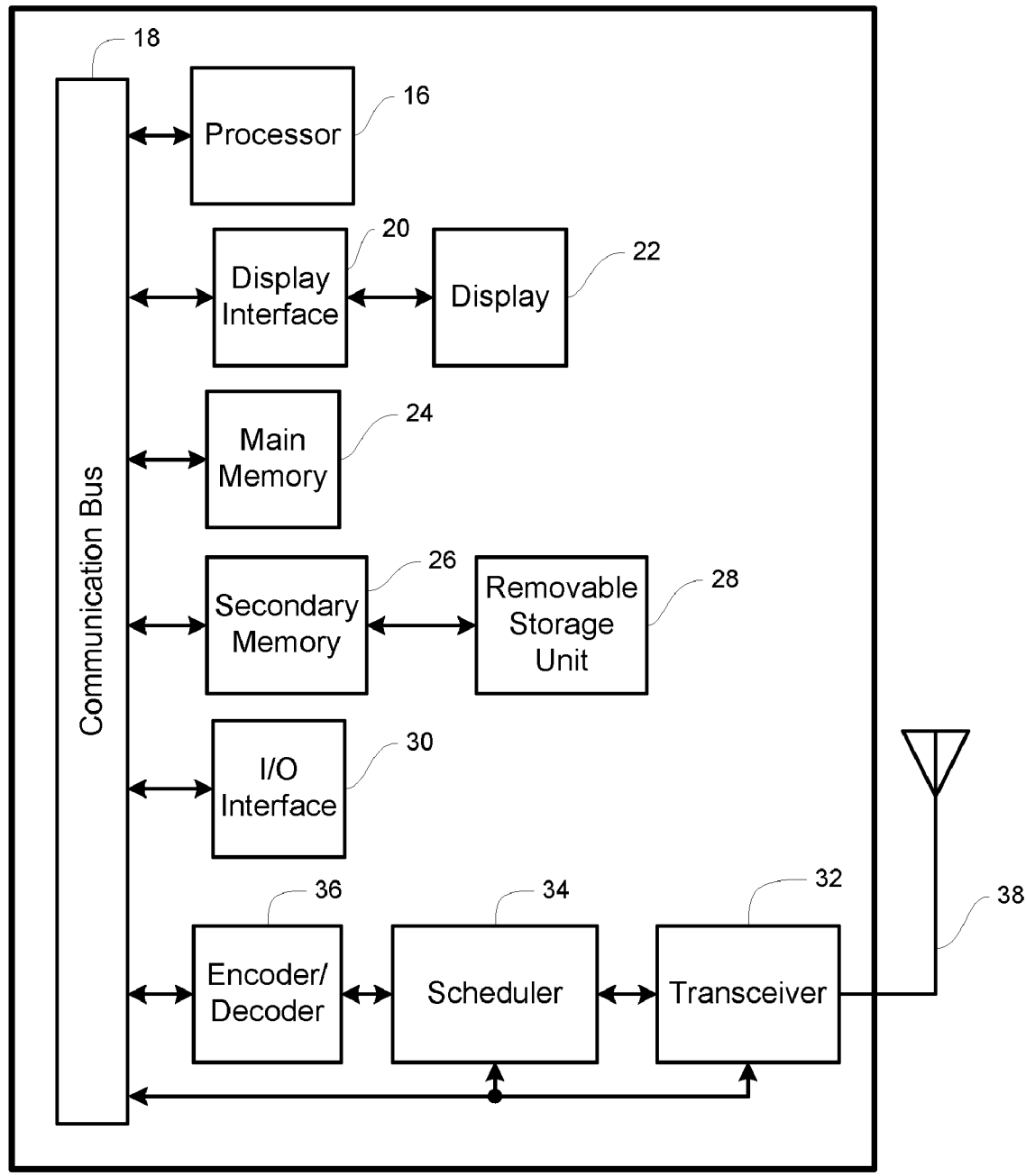
FIG. 2 is a block diagram of an exemplary base station of an LTE communication system constructed in accordance with the principles of the present invention.

FIG. 2 is an exemplary block diagram of communication devices 12 useful for implementing an embodiment of the present invention. Communication devices 12 in an exemplary system 10 include one or more processors, such as processor 16. The processor 16 is connected to a communication infrastructure 18, e.g., a communications bus, crossbar interconnect, network, etc. Communication devices 12 can optionally include or share a display interface 20 that forwards graphics, text, and other data from the communication infrastructure 18 for display on a display unit 22. The communication device 12 also includes a main memory 24, preferably random access memory ("RAM"), and may also include a secondary memory 26. The secondary memory 26 may include, for example, a hard disk drive and/or a removable storage drive, representing a floppy disk drive, a magnetic tape drive, an optical disk drive, etc. The removable storage drive reads from and/or writes to a removable storage unit 28 in a manner well known to those having ordinary skill in the art. Removable storage unit 28, represents, for example, a floppy disk, magnetic tape, optical disk, etc. which is read by and written to by secondary memory 26. As will be appreciated, the removable storage unit 28 includes a computer usable storage medium having stored therein computer software and/or data.

In alternative embodiments, the secondary memory 26 may include other similar means for allowing computer programs or other instructions to be loaded into the computer system. Such means may include, for example, a removable storage unit 28 and an interface (not shown). Examples of such may include a program cartridge and cartridge interface (such as that found in video game devices), a removable memory chip (such as an EPROM, EEPROM or PROM) and associated socket, and other removable storage units 28 and interfaces which allow software and data to be transferred from the removable storage unit 28 to the communication device 12.

In this document, the terms "computer program medium," "computer usable medium," and "computer readable medium" are used to generally refer to media such as but not limited to main memory 24, secondary memory 26, removable storage unit 28, a hard disk installed in hard disk drive, etc. These computer program products are means for providing software to the communication device 12. The computer readable medium allows the communication device 12 to read data, instructions, messages or message packets, and other computer readable information from the computer readable medium. The computer readable medium, for example, may include non-volatile memory, such as floppy, ROM, flash memory, disk drive memory, CD-ROM, and other permanent storage. It is useful, for example, for transporting information, such as data and computer instructions, between other devices within system 10.

Computer programs (also called computer control logic) are stored in main memory 24 and/or secondary memory 26. Computer programs may also be received via communications interface 40. Such computer programs, when executed, enable the node 12 or router 14 to perform the features of the present invention as discussed herein. In particular, the computer programs, when executed, enable the processor 20 to perform the features of the corresponding communication device 12. Accordingly, such computer programs represent controllers of the corresponding device.

Communication device 12 may also include an Input/Output ("I/O") interface 30. I/O interface 30 allows communication device 12 to present information to and accept data from a user through a variety of input/output devices, e.g., keyboard, mouse, touch screen, buttons, microphone, speaker, USB devices, etc. Information transferred via I/O interface 30 are in the form of signals which may be, for example, electronic, electromagnetic, optical, or other signals capable of being received by I/O interface 30.

Communication device 12 further includes a transceiver 32 for transmitting and receiving wireless communication signals encoded in accordance with defined communication protocol standards, such as ITU 3GPP, Release 8, also known as LTE. Transceiver 32 is electrically connected to scheduler 34, which determines which resources are to be used by the communication device 12 during a communication. The scheduler 34 is also electrically connected to a decoder/encoder 36. When the communication device 12 has data packets ready to send to the base station 14, the encoder in the decoder/encoder 36 encodes the packets according to a predefined scheme, then forwards the encoded packets to the scheduler 34 for scheduling prior to transmission from the transceiver 32 via an antenna 38. Likewise, the communication device 12 receives data packets from the base station 14 via the antenna 38 and transceiver 32, determines which resources the data packets use, and forwards the packets to the decoder in the decoder/encoder 36 for decoding prior to processing. Operation of the scheduler 34 is discussed in greater detail below.

Figure 3:
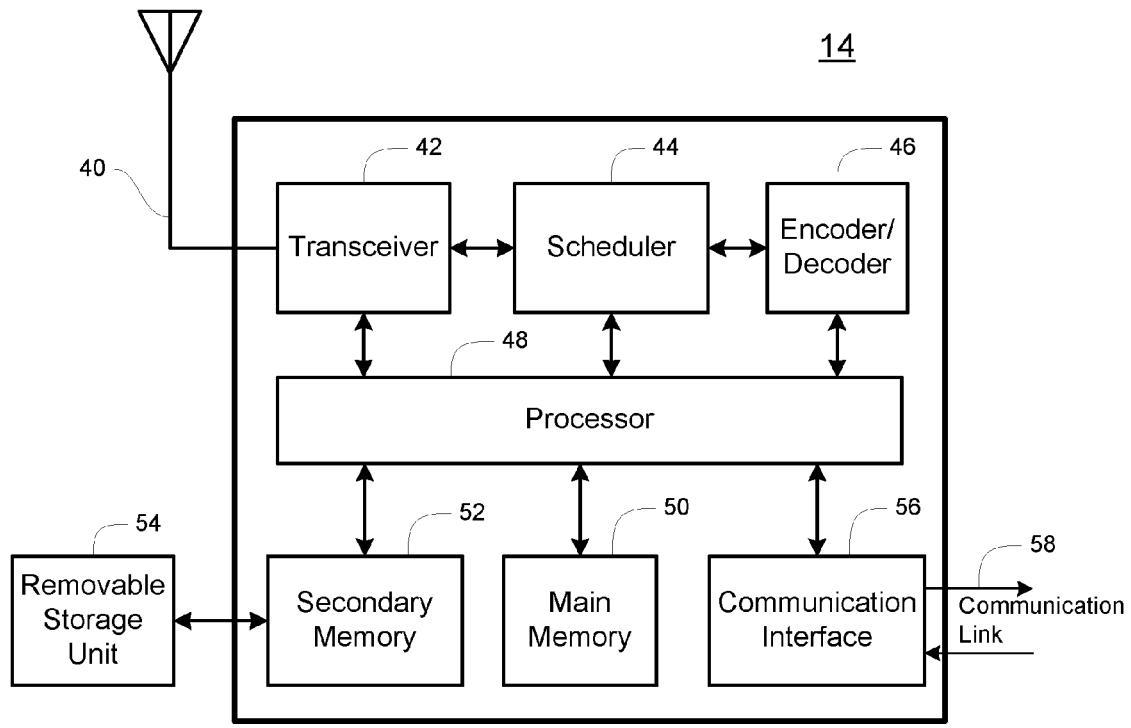
FIG. 3 is a block diagram of an exemplary communication device for use in an LTE communication system constructed in accordance with the principles of the present invention.

Referring now to FIG. 3, a block diagram of an exemplary base station 14 is provided. It should be noted that while FIG. 3 details only the features relevant to the present invention, other features and functions of a typical base station 14 may be included, as is well-known to those of ordinary skill in the art.

Base station 14 receives and transmits wireless communication signals encoded in accordance with defined communication protocol standards, such as ITU 3GPP, Release 8, i.e., LTE, via an antenna 40 coupled to a transceiver 42. The transceiver 42 is coupled to a scheduler 44 which determines which resources are available for each communication device 12 to use and schedules the transmission of data. The scheduler 44 is coupled to an encoder/decoder 46 which encodes raw data packets prior to transmission and decodes received data packets for interpretation by a processor 48.

The processor 48 controls the operation of the base station 14 and the flow of data within the base station 14 and controls the execution of the functions described herein. The base station 14 also includes a main memory 50, preferably random access memory ("RAM"), and may also include a secondary memory 52. The secondary memory 52 may include, for example, a hard disk drive and/or a removable storage drive, representing a floppy disk drive, a magnetic tape drive, an optical disk drive, etc. The removable storage drive reads from and/or writes to a removable storage unit 54 in a manner well known to those having ordinary skill in the art. Removable storage unit 54, represents, for example, a floppy disk, magnetic tape, optical disk, etc. which is read by and written to by secondary memory 52. As will be appreciated, the removable storage unit 54 includes a computer usable storage medium having stored therein computer software and/or data.

The processor 46 is further electrically connected to a communication interface 56. Communication interface 56 allows software and data to be transferred between the base station 14 and external devices, including a public-switched telephone network ("PSTN"), Internet, etc. (not shown). Examples of communication interface 56 may include a modem, a network interface (such as an Ethernet card), a communications port, a PCMCIA slot and card, etc. Software and data transferred via communication interface 56 are in the form of signals which may be, for example, electronic, electromagnetic, optical, or other signals capable of being received by communication interface 56. These signals are provided to communications interface 56 via a communication link (i.e., channel) 58. This channel 42 carries signals and may be implemented using wire or cable, fiber optics, a phone line, a cellular phone link, an RF link, and/or other communications channels.

Figure 4:
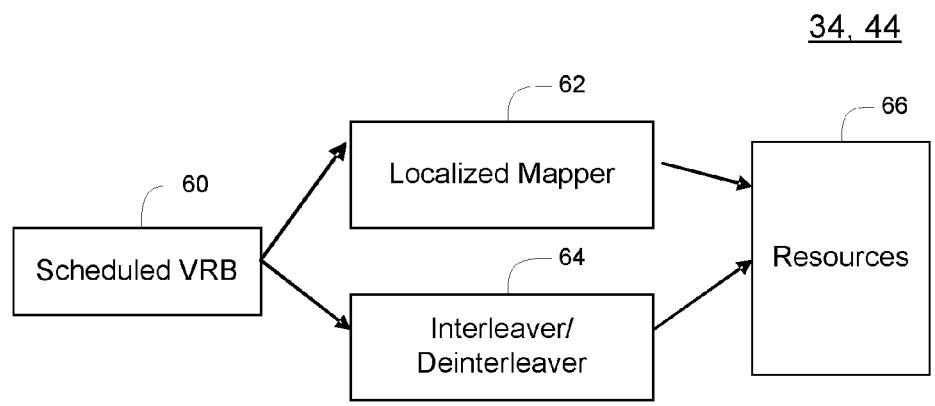
FIG. 4 is a control diagram of a scheduler operating in accordance with the principles of the present invention.

Referring now to FIG. 4, an exemplary control diagram is provided which details the operation of the scheduler 34, 44. When a VRB is scheduled for transmission 60, the scheduler 34, 44 determines whether the VRB is destined for localized transmission or for distributed transmission. If the VRB is to be transmitted locally, then a localized mapper 62 is used which maps the VRB to available PRBs on a one-to-one basis, as the performance of localized transmission is improved when the PRBs are located close together. However, for distributed transmission, where the transmitting unit may not necessarily know the exact composition of the physical channel, the resources should be scattered as the end user devices do not really care where the data is located and more overhead is required to cluster the resources together. Thus, if the VRB is destined for distributed transmission, a distributed mapping process, such as a block interleaver/deinterleaver 64, is used which maps the distributed VRBs to the PRBs 66 in a non-sequential arrangement.

Figure 5:
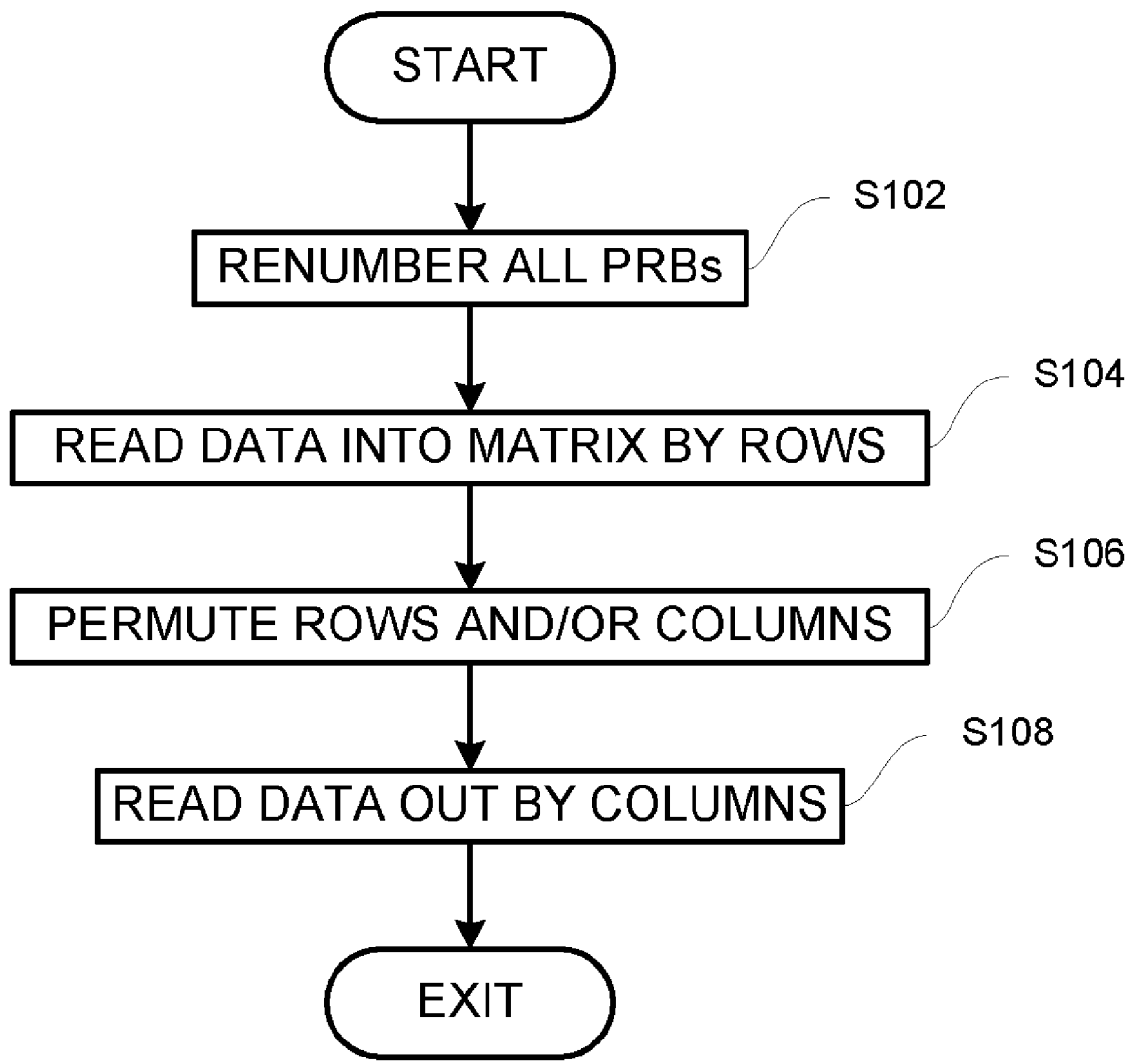
FIG. 5 is a flowchart of an exemplary diversity VRB mapping process performed according to the principles of the present invention example of intermediate indexing.

Referring now to FIG. 5, an exemplary operational flowchart is provided that describes steps performed by an interleaver/deinterleaver 64 of a communication device 12 and/or a base station 14 for mapping distributed resource block indices between physical resource blocks. The physical resource blocks may include, for example, a set of Orthogonal Frequency-Division Multiplexing ("OFDM") subcarriers. It is noted that the following process is performed in reverse order for deinterleaving. The process begins by renumbering, i.e., mapping, all the PRBs in the transmission band (step S102). This mapping can use a fixed pattern, can be changed semi-statically, or through transmission of additional information.

Figure 6:
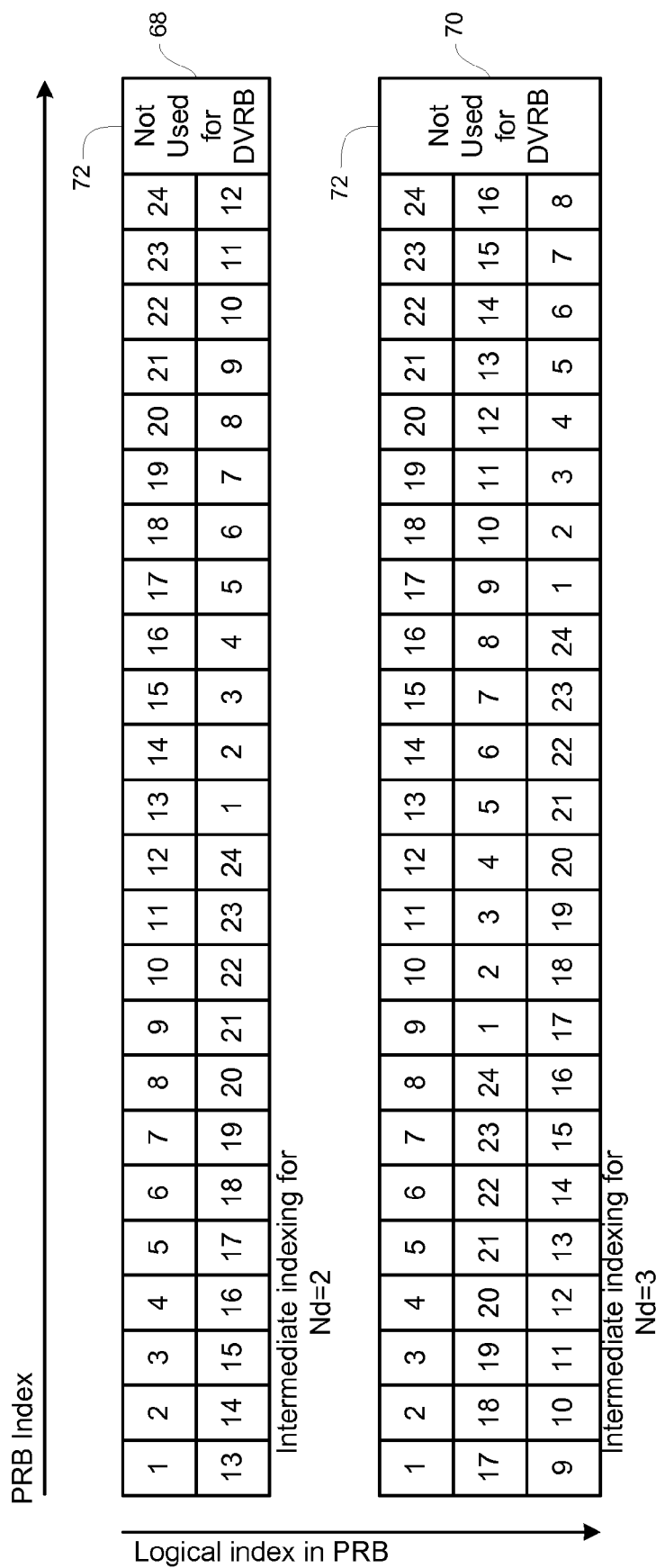
FIG. 6 is exemplary mappings wherein Nd=2 and Nd=3, provided in accordance with one embodiment of the present invention.

FIG. 6 illustrates example mappings in accordance with one embodiment of the present invention. In FIG. 6, the mappings use a fixed Nrb/Nd spacing between sequential PRB logical indices, where Nrb is the total number of RBs available for transmission in the band. In mapping 68, Nd=2; and in mapping 70, Nd=3. The linking of different PRB logical indices together forms a single VRB. The actual number in the figure represents an intermediate indexing which allows for a simple formulation of one embodiment. Here one diversity VRB is mapped to portions of Nd PRBs.

For a bandwidth having an amount of PRBs that is not divisible by Nd, e.g., in FIG. 6 the total amount of PRBs is 25, the indexing scheme is slightly modified by excluding the remaining PRB 72 which is most likely to be assigned to the localized transmission. This excluded PRB 72 can be located anywhere in the band, not only at the edge. Note that this indexing shown in FIG. 6 does not have to be unique and is merely an example of one embodiment of indexing the PRB. Additionally, the excluded PRB 72 can be signaled as a whole PRB using the distributed VRB ("DVRB") signaling scheme, if sufficient room is available in the bitmap.

A mapping is defined between the VRB indices and the intermediate indexing above using this indexing. This mapping, in general, depends on the intermediate mapping used, as well as the signaling available. For the fixed distance mapping shown in FIG. 6, the chosen interleaver can be realized by a block interleaver with a permutation of the rows and columns.

Returning to FIG. 5, the interleaver 64 reads data into a matrix by rows (step S104), permutes the rows and/or columns (step S106), and reads out the data by columns (step S108). The block interleaver 64 is parameterized by the number of rows/columns, and any permutations available. These parameters should be chosen to support the specific environment, e.g., bandwidth, signaling patterns, etc., as applied. For instance, the number of columns should be a multiple of Nd in order to achieve a 'self filling' property, i.e., a user can be assigned all the portions of several scattered PRB using sequential VRB indices. The more columns the interleaver has, the greater the maximum frequency diversity, while smaller numbers of columns tend to allow for easier co-existence with the localized data transmission.

Other examples of intermediate indexing include: the identity mapping in which each 1 is mapped all the logical indices of a PRB, i.e., indices of the PRB map directly to corresponding intermediate indices in the order of occurrence, a fixed distance interleaver as shown in FIG. 5, and a mirrored mapping in which each logical indices, K, in PRB L is linked to the logical index indices Nd-K, in PRB Nrb-L.

Figure 7:
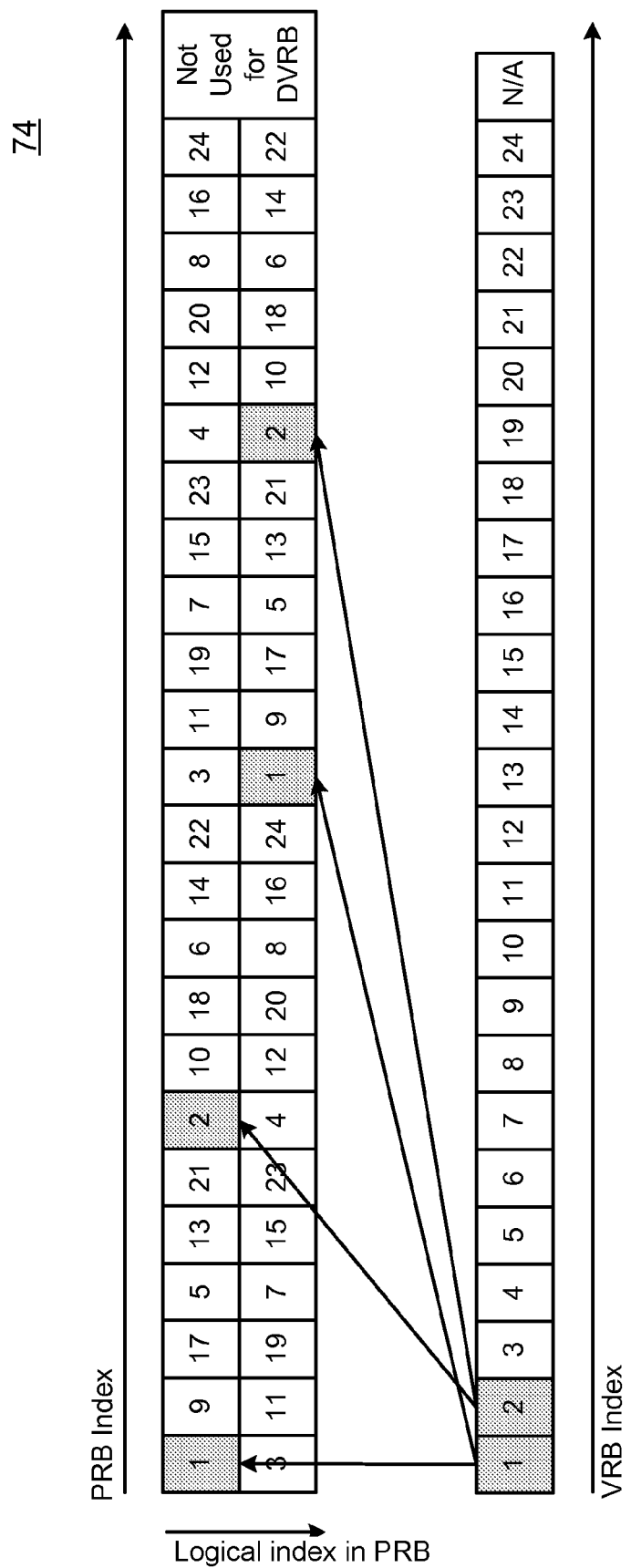
FIG. 7 is an exemplary mapping structure for the scenario where Nd=2 and the bandwidth is 5 MHz in accordance with the principles of the present invention.

FIG. 7 provides a specific example mapping 74 of a block interleaver which supports the LTE framework. In this example, Nd=2 and the BW=5 MHz. The number of columns in the block interleaver may be equal to twice the group size k, as used for the approach where consecutive VRBs are be grouped into groups of k consecutive RBs, the values of which are repeated in Table 1.

TABLE 1

| System BW [RB] | 6-10 | 10-26 | 27-64 | 65-110 |
|---|---|---|---|---|
| Group Size (k) | 1 | 2 | 3 | 4 |

This indexing allows the interleaver to co-ordinate well with the localized RB signaling. The row permutation may be a simple interleaving of the first and middle rows. For instance if there are M rows, the permutation is given by:

$$\{1,M/2,2,M/2+1,3,M/2+2,\ldots,M/2-1,M\}$$

When the total number of PRBs is not an integer multiple of 2K, the block interleaver is simply filled with nulls, which are skipped when reading out the PRB locations.

Another interleaver which works well with the LTE localized assignments may be implemented as 4 columns and $N_{row}$ rows, where $N_{row}$ is divisible by $K^2$, and K is RBG size as described above. This number of columns represents the spacing between contiguous VRB indices and the PRB to which they are assigned. By making the interleaver divisible by $K^2$, one of the localized resource assignment methods which uses a bit map on groups of K PRB separated by (K−1)*K PRB (for a total of $K^2$ PRB) can assign the remaining PRB to a single user if necessary. Column permutations may also be added to maximize the diversity. However this comes at the price of worse co-existence between the localized and distributed transmission. In this example, a column permutation is not included.

There are two advantages to the mapping shown in FIG. 7. First, by assigning VRB in blocks of k DVRB using a group based allocation, a single DVRB group of k assignment can achieve maximal diversity for different bandwidths. Thus, sequential logical indices are separated by the maximum separation possible within the set based on the number of groupings or sub-portions. In other words, for a set of Nrb resources divided into Nd groups, sequential logical indices are separated by a spacing of Nrb/Nd. Second, by assigning a single other DVRB group of k DVRB, the partially used PRBs from the first allocation are filled with the second allocation. This means that the entire PRBs are used and no additional user devices are required for coexistence with the localized RB allocations. In other words, each user can only receive PRB using 1 of 4 assignment schemes, none of which has full flexibility to assign any resource to any users. Thus, if a scheduler wants to assign all the resources, it assigns multiple user devices to use up all the resources. If mirrored mapping is used, then the block interleaver does not necessarily need the row permutations, however the number of columns is increased to Nd*2*k.

Figure 8:
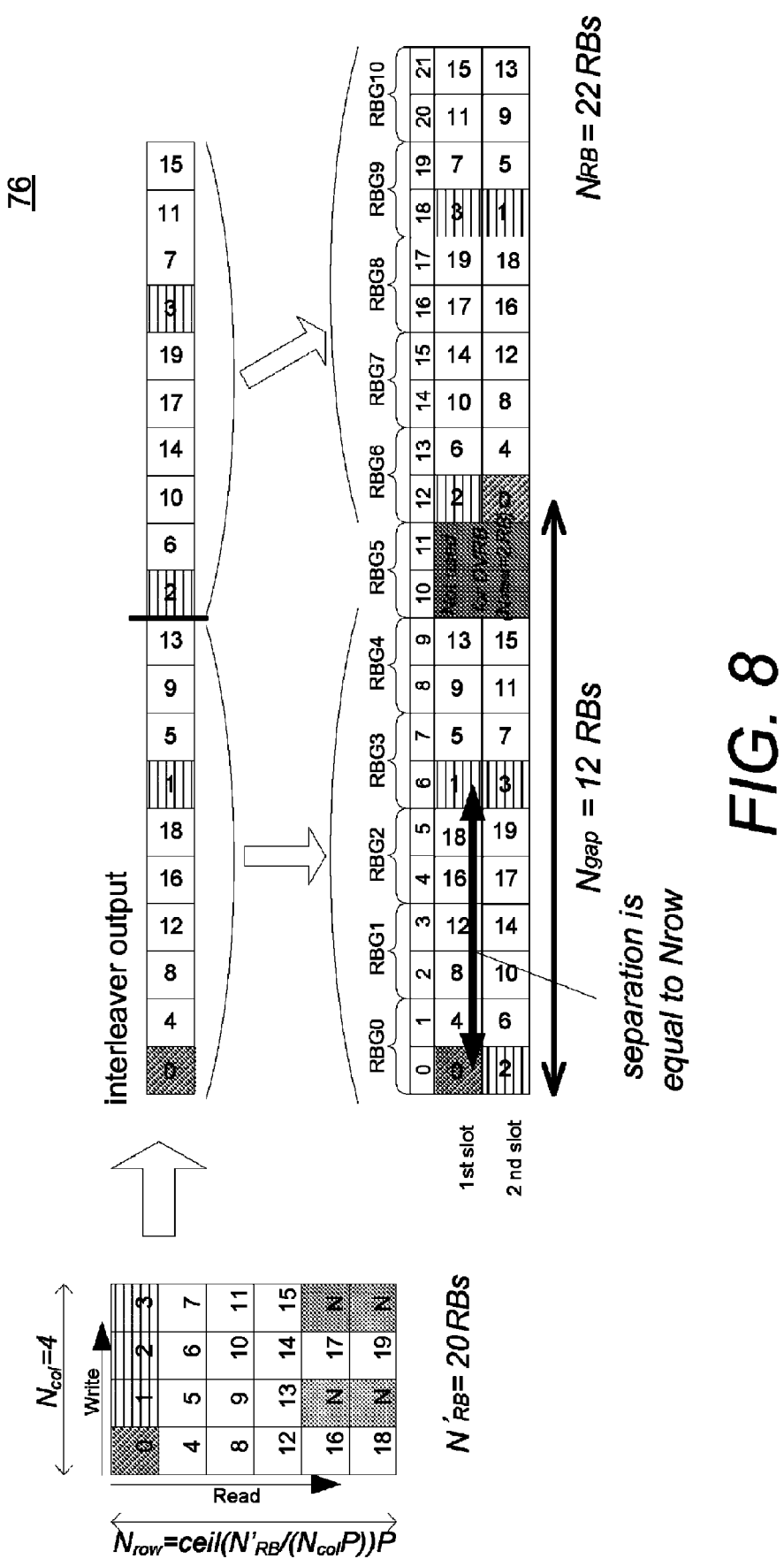
FIG. 8 is an exemplary mapping structure of an alternative block interleaver having 4 fixed columns constructed in accordance with the principles of the present invention.

Referring now to FIG. 8, an alternative embodiment of the present invention includes a block interleaver with 4 fixed columns. This embodiment provides a compromise between coexistence and performance, which weighs co-existence greater than the interleaver originally designed above. This interleaver 64 improves the performance of DVRB users which are assigned contiguous resources, which, in turn, allows for DVRB users to be assigned resources using less signaling overhead. However, this embodiment comes at a price of making it more difficult to place localized users as there are less contiguous PRB available for assignment.

There are several advantages to the mapping 76 shown in FIG. 8. First, by assigning contiguous VRB, the PRB assigned are maximally separated for the first 2 RB capturing a large portion of the frequency diversity gain. The second is after the first two PRB, a so call "self-filling" property appears in which the second halves of the PRB begin to be filled again. This property results from the number of columns being a multiple of Nd and allows for 4 separated, fully-used PRBs to be assigned using the compact assignment which would otherwise require the use of one of the larger assignments. Third, as the number of rows is a multiple of K, the RBG, i.e., groups of K PRB, the assigned PRBs completely fill up a full RBG before moving on and beginning to fill a new RBG.

The present invention can be realized in hardware, software, or a combination of hardware and software. Any kind of computing system, or other apparatus adapted for carrying out the methods described herein, is suited to perform the functions described herein.

A typical combination of hardware and software could be a specialized or general purpose computer system having one or more processing elements and a computer program stored on a storage medium that, when loaded and executed, controls the computer system such that it carries out the methods described herein. The present invention can also be embedded in a computer program product, which comprises all the features enabling the implementation of the methods described herein, and which, when loaded in a computing system is able to carry out these methods. Storage medium refers to any volatile or non-volatile storage device.

Computer program or application in the present context means any expression, in any language, code or notation, of a set of instructions intended to cause a system having an information processing capability to perform a particular function either directly or after either or both of the following a) conversion to another language, code or notation; b) reproduction in a different material form.

In addition, unless mention was made above to the contrary, it should be noted that all of the accompanying drawings are not to scale. Significantly, this invention can be embodied in other specific forms without departing from the spirit or essential attributes thereof, and accordingly, reference should be had to the following claims, rather than to the foregoing specification, as indicating the scope of the invention.

What is claimed is:

1. An apparatus for communication using a wireless communication network, the apparatus comprising:
   an interleaver, the interleaver:
      co-existing with a localized transmission arrangement if the localized transmission arrangement is present; and
      interleaving assigned resources for a distributed transmission arrangement by mapping a set of logical indices to a set of physical resource blocks, the set of logical indices including sequential logical indices being separated by a maximum spacing within the set of physical resource blocks; wherein the mapping comprises: creating an intermediate indexing matrix of logical elements of at least one physical resource block; and permutating rows and columns of the intermediate indexing matrix; and
   a transceiver in electrical communication with the interleaver, the transceiver operable to transmit and receive data packets through the wireless communication network.

2. The apparatus of claim 1, wherein the set of physical resource blocks includes a set of Orthogonal Frequency-Division Multiplexing subcarriers.

3. The apparatus of claim 1, wherein the network operates using Long Term Evolution.

4. The apparatus of claim 1, wherein the at least one physical resource block is divided into a predetermined amount of sub-portions, and wherein the intermediate indexing links the predetermined amount of sub-portions together using a predefined pattern.

5. The apparatus of claim 4, wherein the predetermined amount of sub-portions is one of two and three.

6. The apparatus of claim 4, wherein the mapping comprises a mirrored mapping in which each logical index, K, in physical resource block L is linked to a logical index, Nd-K, in an intermediate indexing matrix, where Nd is the predetermined amount of sub-portions.

7. The apparatus of claim 4, wherein the pattern links sub-portions separated by a fixed spacing.

8. The apparatus of claim 1, wherein the mapping comprises an identity mapping in which each logical element of the at least one physical resource block is mapped directly to a corresponding element of the intermediate indexing matrix in a order of occurrence.

9. The apparatus of claim 1, further comprising:
   a deinterleaver electrically coupled to the transceiver, the deinterleaver operable to deinterleave interleaved data packets received from the wireless communication network.

10. A method of mapping assigned resources for a distributed transmission arrangement in a wireless communication network, the method comprising:
    mapping a set of logical indices to a set of physical resource blocks, the set of logical indices including sequential logical indices being separated by a maximum spacing within the set of physical resource blocks; wherein the mapping comprises: creating an intermediate indexing matrix of logical elements of at least one physical resource block; and permutating rows and columns of the intermediate indexing matrix; and
    the mapping co-existing with a localized transmission arrangement if the localized transmission arrangement is present in the wireless communication network.

11. The method of claim 10, wherein the set of physical resource blocks includes a set of Orthogonal Frequency-Division Multiplexing subcarriers.

12. The method of claim 10, wherein the network operates using Long Term Evolution.

13. The method of claim 10, wherein the at least one physical resource block is divided into a predetermined amount of sub-portions, and wherein the intermediate indexing links the predetermined amount of sub-portions together using a predefined pattern.

14. The method of claim 13, wherein the predetermined amount of sub-portions is one of two and three.

15. The method of claim 13, wherein the mapping comprises a mirrored mapping in which each logical index, K, in physical resource block L is linked to a logical index, Nd-K, in an intermediate indexing matrix, where Nd is the predetermined amount of sub-portions.

16. A system for mapping assigned resources for distributed transmission through a Long Term Evolution communication network, the system comprising:
    a transmitting apparatus including:
       an interleaver, the interleaver:
          co-existing with a localized transmission arrangement if the localized transmission arrangement is present; and
          interleaving assigned resources for a distributed transmission arrangement by mapping a set of logical indices to a set of physical resource blocks, the set of logical indices including sequential logical indices being separated by a maximum spacing within the set of physical resource blocks; wherein the mapping comprises: creating an intermediate indexing matrix of logical elements of at least one physical resource block; and permutating rows and columns of the intermediate indexing matrix; and a transceiver electrically connected to the interleaver, the transceiver operable to transmit data packets through the Long Term Evolution communication network; and a receiving apparatus in communication with the transmitting apparatus, the receiving apparatus including:

a transceiver operable to receive data packets from the Long Term Evolution communication network; and a deinterleaver electrically connected to the transceiver, the deinterleaver deinterleaving interleaved data packets received from the Long Term Evolution network.

17. The system of claim 16, wherein the set of physical resource blocks includes a set of Orthogonal Frequency-Division Multiplexing subcarriers.

* * * * *